(12) United States Patent
Chieng et al.

(10) Patent No.: US 8,224,469 B2
(45) Date of Patent: Jul. 17, 2012

(54) SYSTEMS AND METHODS FOR CONTROLLING AUDIO VOLUME IN THE PROCESSOR OF A HIGH DEFINITION AUDIO CODEC

(75) Inventors: Daniel L. Chieng, Austin, TX (US); Douglas D. Gephardt, Dripping Springs, TX (US); Larry E. Hand, Meridian, MS (US); Jeffrey M. Klaas, Lakeway, TX (US); Adam Zaharias, Austin, TX (US)

(73) Assignee: D2Audio Corporation, Milpitas, CA (US)

( * ) Notice: Subject to any disclaimer, the term of this patent is extended or adjusted under 35 U.S.C. 154(b) by 980 days.

(21) Appl. No.: 12/202,355

(22) Filed: Sep. 1, 2008

(65) Prior Publication Data
US 2009/0062948 A1 Mar. 5, 2009

Related U.S. Application Data

(60) Provisional application No. 60/969,608, filed on Sep. 1, 2007.

(51) Int. Cl.
*G06F 17/00* (2006.01)
*G06F 9/30* (2006.01)
*G06F 9/40* (2006.01)
*H03G 3/00* (2006.01)
(52) U.S. Cl. .................. 700/94; 381/104; 712/208
(58) Field of Classification Search .............. 700/94; 710/65, 69; 712/35, 36, 208, 209, 213; 381/104, 381/119, 120
See application file for complete search history.

(56) References Cited

U.S. PATENT DOCUMENTS

| | | | |
|---|---|---|---|
| 6,012,142 A | 1/2000 | Dokic | |
| 6,016,075 A | 1/2000 | Hamo | |
| 6,205,223 B1 | 3/2001 | Rao | |
| 6,279,045 B1 | 8/2001 | Muthujumaraswathy et al. | |
| 6,294,954 B1 | 9/2001 | Melanson | |
| 6,301,366 B1 | 10/2001 | Malcolm et al. | |
| 6,427,181 B1 | 7/2002 | Furuhashi | |
| 6,748,515 B1 | 6/2004 | Hendrickson | |
| 6,920,553 B1 | 7/2005 | Poisner | |
| 7,425,992 B2 | 9/2008 | Feeler et al. | |

(Continued)

FOREIGN PATENT DOCUMENTS
EP 1 677 574 A 7/2006

OTHER PUBLICATIONS

International Search Report dated Nov. 25, 2008 for Application No. PCT/US2008/074963.

(Continued)

*Primary Examiner* — Jesse Elbin
(74) *Attorney, Agent, or Firm* — Fliesler Meyer LLP (57) ABSTRACT

Systems and methods for controlling the audio volume of an audio signal in an HDA codec having a programmable processor such as a DSP, wherein the codec receives digital audio signals and audio volume control verbs over an HDA bus, and the audio volume levels associated with the audio volume control verbs are used by the processor in the generation pulse width modulated (PWM) output signals, thereby controlling the audio volume levels of the output signals. The processor may be configured to adjust non-volume parameters such as PWM deadtime, in addition to adjusting audio volume, based on the audio volume levels. The codec may be implemented in a PC or other system that implements an HDA system that includes the HDA bus and HDA codec.

26 Claims, 4 Drawing Sheets

U.S. PATENT DOCUMENTS

| | | | |
|---|---|---|---|
| 7,640,041 | B2 | 12/2009 | Ragan |
| 7,791,427 | B2 | 9/2010 | Kost |
| 8,115,564 | B2 | 2/2012 | Kost |
| 2002/0119803 | A1 | 8/2002 | Bitterlich |
| 2005/0160195 | A1 | 7/2005 | Bruner et al. |
| 2005/0276426 | A1* | 12/2005 | Ono et al. .................. 700/94 |
| 2006/0149402 | A1* | 7/2006 | Chung ....................... 700/94 |
| 2006/0247811 | A1 | 11/2006 | Zaucha |
| 2007/0005160 | A1 | 1/2007 | Zaucha |
| 2007/0067506 | A1 | 3/2007 | Cho |
| 2007/0239438 | A1 | 10/2007 | Chuang |
| 2009/0060228 | A1 | 3/2009 | Chieng et al. |

OTHER PUBLICATIONS

Maxim Integrated Products, "Innovative Audio Cost-Reduction and Space-Saving Solutions Tune Out the Competition," 2006, pp. 1-23, XP002503538; http://newsletter.spezial.de/pdfdata/AUDIO_9.pdf> [retrieved on Nov. 11, 2008].

Princeton Technology Corp., "Stereo 2W Class-D Amplifier With Built-In Audio Processor," Jul. 2008, pp. 1-4, XP002503539; http://www.princeton.com/tw/> [retrieved on Nov. 11, 2008].

"4-Channel DAC and 6-Channel ADC High Definition Audio Codec, ALC262 Series Datasheet (Rev. 1.7)," Realtek Semiconductor Corp., Mar. 22, 2007, pp. i-64, http://www.realtek.cz/download/datsheets/alc262_v1.7.pdf.

"High Definition Audio Specification, Revision 1.0," Intel Corporation, Apr. 15, 2004, http://download.intel.com/standards/hdaudio/pdf/HDAudio_03.pdf, pp. i-173.

"Low Power, Stereo CODEC w/Headphone & Speaker Amps," Cirrus Logic, Dec. 1, 2006, pp. 1-82, http://www.digchip.com/datasheets/download_datasheet.php?id=1104824&part-number=CS42L52.

"Overview of Audio Codec '97, revision 1.0," Intel Corporation, http://euc.jp/periphs/AC97_OVR.PDF, pp. 1-4, 1996.

International Search Report and Written Opinion dated Jan. 30, 2009 for Application No. PCT/US2008/074964, 13 pages.

International Search Report and Written Opinion dated Jan. 30, 2009 for Application No. PCT/US2008/074966, 14 pages.

International Search Report dated Nov. 27, 2008 for Application No. PCT/US2008/074965.

International Search Report and Written Opinion dated Jan. 30, 2009 for Application No. PCT/US2008/074967, 14 pages.

Kennedy, R., et al., "Tailor configurable processors for audio codecs," Electronic Engineering Times-Asia, Aug. 16, 2006, pp. 1-3.

"Precision Switchmode Pulse Width Modulation Control Circuit," TL594, Semiconductor Components Industries, LLC, Nov. 2005 (12 pages).

"Dual-Channel Pulse-Width-Modulation (PWM) Control Circuit," TL1454A, TL1454AY, Texas Instruments, Incorporated, 2002 (26 pages).

* cited by examiner

SYSTEMS AND METHODS FOR CONTROLLING AUDIO VOLUME IN THE PROCESSOR OF A HIGH DEFINITION AUDIO CODEC

CROSS-REFERENCE TO RELATED APPLICATIONS

This application claims the benefit of U.S. Provisional Patent Application 60/969,608, filed Sep. 1, 2007, which is hereby incorporated by reference as if set forth herein in its entirety.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for booting processors such as DSP's that are incorporated into codecs in a PC's (Personal computer's) High Definition Audio system, wherein the DSP's handle audio volume control in order to provide more efficient and higher quality audio.

In one embodiment, an HDA codec includes one or more conventional HDA widgets coupled to a programmable processor such as a DSP. The DSP is configured to function as a Class-D PWM controller, generating PWM output signals. The codec receives time-multiplexed digital audio signals and HDA verbs from an HDA bus that is coupled to the codec. The widgets in the codec include a converter that pulls the time-multiplexed audio data and verbs off the HDA bus and converts them to a format suitable for internal use by the codec. When an audio volume control verb is received by the codec, the audio volume levels associated with the verb are stored in registers that are accessible by the DSP. The DSP reads the registers to determine audio volume levels for the channels in the codec and adjusts the manner in which the PWM output signals are generated based on the audio volume levels. This may include not only adjusting the audio volumes of the respective channels, but also adjusting non-volume parameters involved in the generation of the PWM output signals.

Alternative embodiments may include PC systems incorporating the processor-based HDA codec, and methods for controlling audio volume in a processor-based HDA codec by adjusting the operation of the processor based on HDA audio volume control verbs.

PC-Based Audio

With the proliferation of PCs and advances in computer technologies, there has been a demand for PCs that have an increasing number of advanced features. Customers that purchase multimedia PCs and high-end gaming PCs in particular are demanding premium audio quality in order to achieve the ultimate audio/visual experience from their PCs. This demand has been addressed to some extent by the High Definition Audio Specification introduced by Intel.

When Intel's 1997 Audio Codec standard (AC'97) was introduced, PC users typically listened to music and movies that only had stereo sound. As multi-channel audio formats such as Dolby Digital and DTS became more popular, users became accustomed to these audio formats and began to expect full surround, multi-speaker sound using these formats to be available in a PC environment. While AC'97 technology was initially adequate, it has not been able to keep pace with more recent advancements (e.g., newer audio and video encoding/decoding algorithms) that enable the PC to produce higher-quality audio.

Beginning with the introduction of Intel's High Definition Audio Specification Rev 1.0 in 2004, which is incorporated herein by reference, the HDA interface has been gradually gaining popularity in the PC space. The HDA architecture defined by the Intel specification attempts to meet the need for high quality audio in the PC space. This architecture defines the delivery of high fidelity audio content from a PC's memory to one or more audio codecs using an HDA controller that performs direct memory access (DMA) transfers of audio data over an HDA bus. The audio data delivered over the HDA bus is received, processed and output by the various components of the codecs (referred to in the HDA specification as "widgets").

While the HDA specification allows quite a bit of flexibility in the design of an HDA system for a PC, this flexibility is lost when the design is implemented. For instance, while an HDA system may have multiple codecs that perform different types of processing on audio data, these codecs are hardwired and their functionality cannot be changed. It would be desirable to provide systems and methods that maintain the flexibility of the HDA system, including enabling changes to the functionality of the system after it is implemented.

This flexibility is provided in one system by providing an HDA codec that incorporates a digital signal processor (DSP). The DSP enables intelligent processing of audio signals and is programmable so that the functionality of the codec can be modified by changing the programming of the DSP. The DSP can be programmed to control a variety of functions, including functions such as audio volume and muting that are handled by separate HDA widgets in conventional HDA codecs.

High Definition Audio (HDA)

With the introduction of Intel's High Definition Audio Specification Rev 1.0 in 2004, the HDA interface has been gradually gaining popularity in the PC space. Users of multimedia PCs and high-end gaming PCs in particular are demanding premium audio quality in order to achieve the ultimate audio/visual experience from their PCs. The HDA architecture bridges the gap in delivering high fidelity audio content from the memory system of the PC to the audio codecs of the HDA system.

The primary goal of the HDA specification is to describe an infrastructure within a PC environment which is designed to support high quality audio. This infrastructure provides a mechanism for transferring audio data directly from the PC's memory system to one or more audio codecs via an HDA bus. The codecs typically convert the digital audio data received from the memory to analog signals and process these signals to output signals that can be provided as, for instance, a line output, a modem output, or an output to an amplifier.

Figure 1:
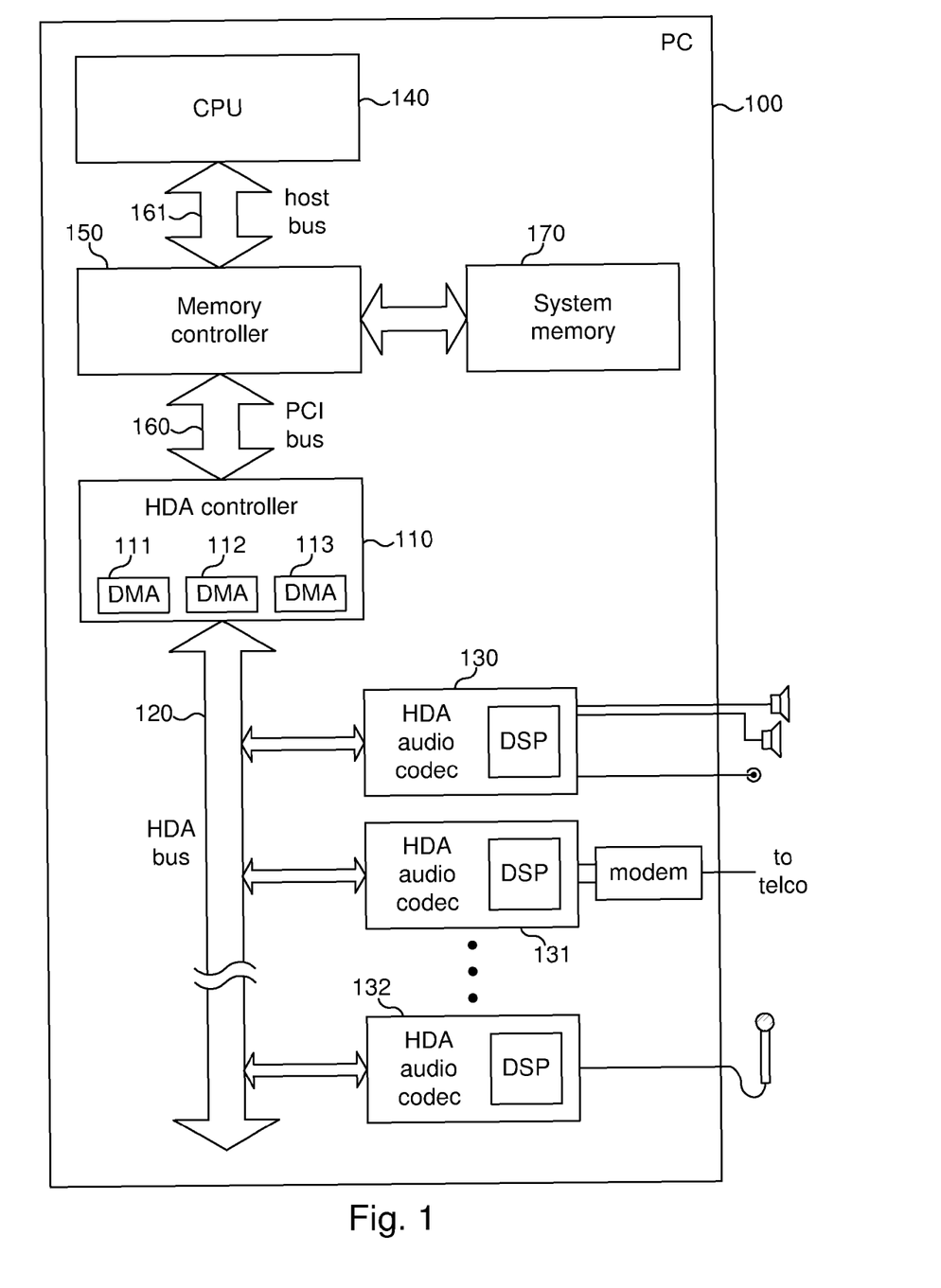
FIG. 1 is a functional block diagram illustrating the hardware structure of a system having an High Definition Audio (HDA) architecture that incorporates DSP-based codecs in accordance with one embodiment.

Referring to FIG. 1, a functional block diagram illustrating the hardware structure of a system having an HDA architecture that incorporates DSP-based codecs is shown. As depicted in this figure, the HDA architecture in a PC 100 includes an HDA controller 110, an HDA bus 120 and several codecs 130-132. (While FIG. 1 includes three codecs, there may be more or fewer codecs in a given embodiment). These components are constructed on the motherboard of the PC, along with CPU 140 and memory controller 150.

HDA controller 110 is coupled to memory controller 150 via a bus (160) such as a PCI bus or other type of system bus. Memory controller 150 is coupled to CPU 140 by a host bus 161. Memory controller 150 is also coupled to the system memory 170. Codecs 130-132 may be connected to one or more converters in order to convert the audio data processed by the codecs to a suitable output format, or to convert input data received by the codecs to appropriate formats for use by the codecs. The audio processing of the codecs is performed by a combination of conventional widgets and a programmable processor such as a DSP. The output signals produced by the converters may be provided to a variety of output devices such as amplifiers, speakers or headphones.

HDA controller 110 acts as a bus mastering input/output (I/O) device on the PCI bus. HDA controller 110 includes multiple DMA engines 111-113. (Although three DMA engines are depicted in the figure, there may be more or fewer in a given embodiment.) DMA engines 111-113 control the transfer of data between system memory 170 (via memory controller 150 and bus 160) and the various HDA codecs 130-132. The DMA engines can transfer data from the codecs to the system memory, as well as transferring data from the system memory to the codecs.

HDA bus 120 is configured to support serial data transfers between HDA controller 110 and codecs 130-132. HDA bus 120 is also used to distribute a 24 MHz bit line clock from HDA controller 110 to codecs 130-132. This bit line clock is used by the controller and the codecs to enable the transfer of data over the HDA bus. The codecs use the bit line clock to extract time-multiplexed, serialized data from the HDA bus.

Typically, each of codecs 130-132 will extract a stream of digital data from the time-multiplexed data on HDA bus 120. This digital data will be converted to an analog signal and processed by the codec. The processing may include performing a variety of functions, such as audio volume control, muting, mixing, and the like. As noted above, the processed data may be provided to a converter which can convert the processed signal if necessary to produce an output signal (e.g., the converter may convert the analog signal into a digital output signal). In addition to processing audio data, codecs 130-132 may provide control data to HDA controller 110 via HDA bus 120. The codecs may also receive input signals (e.g., an analog input signal from a microphone), process the signals, and provide these signals to the HDA controller via the HDA bus.

Data is transferred between system memory 170 and codecs 130-132 in "streams." In the HDA specification, a stream is a logical connection between one of the codecs and a buffer in the system memory. Each stream is driven by a corresponding one of the DMA engines in the HDA controller. The DMA engine can only drive a single stream, so if the system has more streams than DMA engines, one or more of the streams must remain inactive until DMA engines become available to drive them. A stream may be either an input stream or an output stream, but not both. Output streams are considered broadcast streams, and may be received by more than one of the codecs. Input streams, the other hand, are associated with only a single one of the codecs.

As noted above, the streams are conveyed over the HDA bus as time-multiplexed data. The HDA bus transmits data in successive frames. The frame rate is 48 kHz, so each frame is 20.83 microseconds long. The frame can be broken down into fields, including a field for command and/or response data, as well as sample fields for each of the one or more streams. The frame may also include null space if less than the maximum number of streams is being transmitted. Within each sample in a stream of data, there are typically fields for data corresponding to two channels (e.g., left and right stereo channels). It should be noted, however, that more channels (e.g., left, right, left rear and right rear) can be transmitted. Also, multiple sample fields can be used to convey data for a single channel that has a data rate greater than the 48 kHz frame rate.

The HDA specification is intended to define an architecture in which codecs have a modular construction. The codecs make use of parametrized building blocks (widgets) to form a codec that is discoverable and configurable. The widgets, and collections of widgets, are uniquely addressable nodes in the HDA architecture. As a result, a software driver can identify and control the various operations of the codecs.

The widgets that form an HDA codec are interconnected to form function groups within the codecs. A codec can contain more than one function group. A codec may, for example, contain several audio function groups that process audio data for different audio channels. Widgets that are commonly used in these audio function groups include audio output converter widgets, audio input converter widgets, i/o (pin) widgets, mixer widgets, selector (mux) widgets, power state widgets, and audio volume widgets.

HDA Codec Having an Integral Processor

Conventionally, the widgets in a codec are hardwired together. A particular codec may be designed to perform a number of functions, but these functions are performed by widgets that have fixed functions, so the functions of the codec are also fixed once its design has been established and the codec constructed. The present codec, on the other hand, incorporates a programmable processor such as a digital signal processor (DSP).

The DSP provides the capability to perform intelligent processing of audio data. In one embodiment, the DSP is programmed to function as a Class-D pulse width modulated (PWM) controller that is integrated into an HDA codec. The PWM controller receives digital audio signals and generates PWM output signals that can be forwarded to speakers, headphones or amplifiers.

Figure 2:
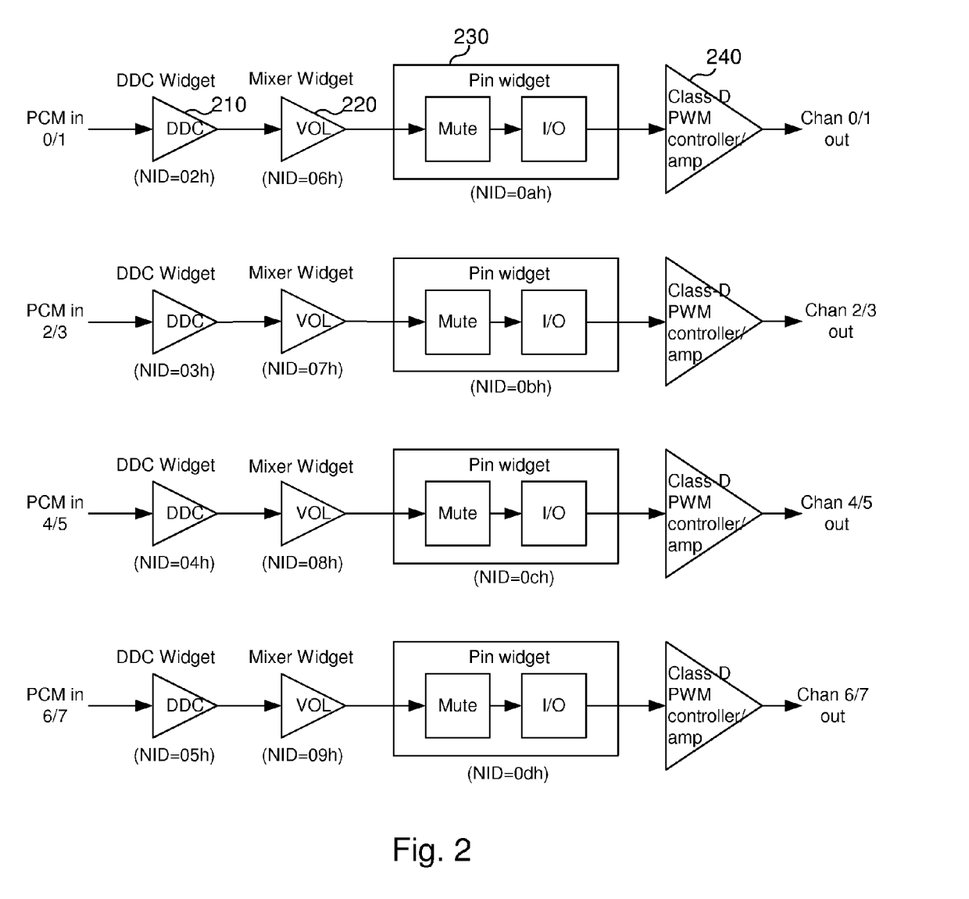
FIG. 2 is a diagram illustrating the interconnection of widgets in an exemplary HDA codec with an integrated PWM controller/amplifier in accordance with one embodiment.

Referring to FIG. 2, a diagram illustrating the interconnection of widgets in an exemplary HDA codec with an integrated PWM controller/amplifier is shown. In this example, the codec is configured to process eight channels (four stereo pairs) of audio data. Each stereo pair is converted from an input digital format to an internal digital format by a DDC widget (e.g., 210). Because the stream(s) of data on the HDA bus are time-multiplexed, the DDC widget pulls the appropriate packets of audio data from the bus and formats the data into a digital stream (e.g., an I2S data stream) that can be processed in the codec. (In this embodiment, the codec processes the signal in a digital, rather than analog, form.) The digital signal is then processed by a mixer widget (e.g., 220), which may sum the signal with other signals or control the audio volume of the signal, and a pin widget (e.g., 230), which can mute the signal and output the signal to a PWM controller/amplifier (e.g., 240).

It should be noted that the mixer widget and pin widget may be virtual (or logical) components of the codec. While the DDC widget is a hardware component that is necessary to pull data off the HDA bus, the mixer and pin widgets usually perform functions that can be provided by the DSP. Consequently, the mixer and pin widgets may be present as hardware (which need not be used), or the DSP may simply represent these widgets logically. In other words, the codec may present itself to the HDA bus as if it included these widgets, mapping the node ID's for these widgets to the DSP. Commands addressed to these widgets are therefore forwarded to the DSP, where they are processed in the same manner as if the widgets had been physically present. For instance, where the mixer widget would normally control the audio volume of the audio signal processed by the codec, the DSP can control the audio volume as a function of the PWM controller. Similarly, where the pin widget would normally control muting and input/output functions, these functions can be implemented in the PWM controller.

An all digital Class-D PWM controller is superior to its analog counter-part because of the inclusion of a DSP. The DSP allows customization of audio sound by implementing audio effects processing such as parametric equalization, psycho-acoustic effects, room equalization, virtual surround sound, bass boost, mixing, custom filters, and so on. The DSP can also be configured to perform functions that are conventionally implemented in the widgets of the codec, such as the audio volume control (normally implemented in the mixer widget), muting control and I/O control (normally implemented in the pin widget).

The audio volume control and muting functions of an audio codec may appear to be mundane functions that, although necessary, can be implemented at any point in the audio processing channel without any significant impact on the system. This is not the case, however. In a conventional HDA codec, a converter converts digital data received from the HDA bus to an analog signal which is then processed by the other widgets in the codec. For instance, a mixer widget controls the audio volume of the analog audio signal by reducing the amplitude of the signal. This reduces the dynamic range of the signal and thereby reduces the quality of the signal. In the present systems, on the other hand, the audio signal is maintained in a digital form as it is processed, so no dynamic range is lost during processing. The audio volume is controlled by the DSP and PWM computation engine when the PWM output pulses are generated, producing a higher quality output signal.

The quality of the output signal may also be increased because of the ability of the DSP to intelligently modify its operation based on the audio volume level of the signal. For example, when the audio volume level is high, the waveform of the audio signal typically has wide excursions from 0 (high peak-to-peak values). in order to minimize audible distortion of such a signal, the deadtime between high-side and low-side PWM signals must be minimized. Minimized deadtime, however, may increase the current drawn by a PWM output stage and thereby increase the power consumption associated with the audio output. By contrast, if the audio volume level is low, the deadtime between the high-side and low-side PWM signals results in much less audible distortion, so much greater deadtime can be tolerated. The increased deadtime reduces the power consumption associated with the audio output. Thus, the DSP can be configured to adjust the deadtime according to the audio volume level in order to both reduce distortion and reduce power consumption.

The control of muting in the DSP also has advantages over the conventional control in the pin widget. In both cases, when the channel is muted the audio volume level is 0, so reduction of dynamic range is not an issue. In the conventional HDA codec, however, the audio signal is subject to noise and may produce some nonzero output signal. While this may not be especially objectionable, the processing of this 0-level (but potentially noisy) signal requires power. This power is consumed for no purpose. In the present systems, on the other hand, the DSP can recognize that the audio volume level is 0 and adjust its operation (and that of the PWM output computation engine) to suspend non-required functions and otherwise reduce power consumption. When the channel is no longer muted, the DSP can adjust its operation to return to normal operating parameters.

Figure 3:
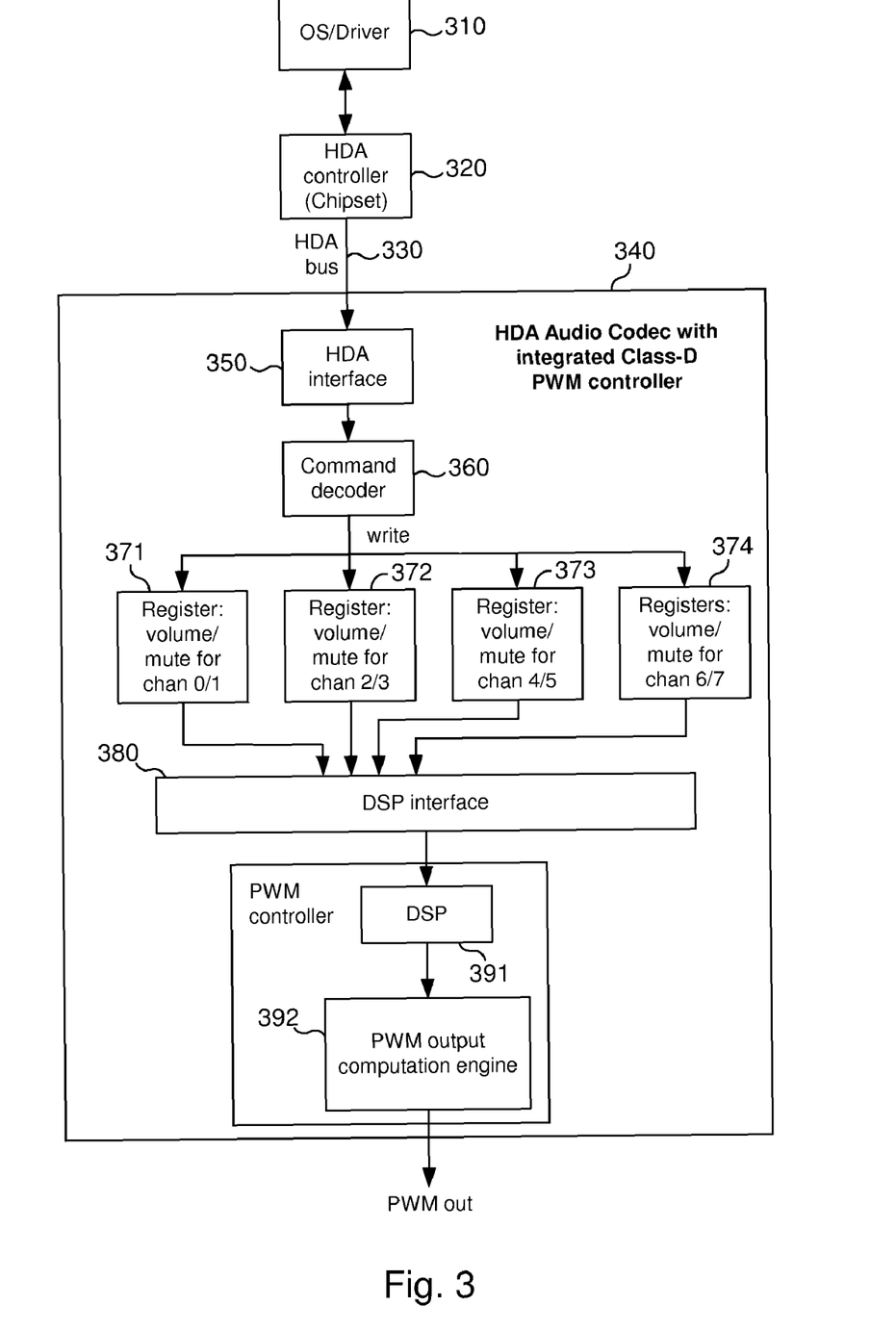
FIG. 3 is a diagram illustrating a codec architecture used to implement processor-based audio volume control in accordance with one embodiment.

Referring to FIG. 3, a diagram illustrating a codec architecture used to implement processor-based audio volume control is shown. In this embodiment, an application is executing on a PC. The application sends commands to the PC's operating system or to a driver 310 to cause HDA controller 320 to send audio volume control verbs and corresponding data over HDA bus 330 to codec 340. Codec 340 has an HDA interface 350 which is connected to HDA bus 330. HDA interface 350 pulls the verbs and data from HDA bus 330. Command decoder 360 receives the verbs and data from HDA interface 350 and decodes the verbs. When command decoder 360 decodes an audio volume control verb, it takes the associated data which defines the audio volume level and stores this information in one or more volume/mute registers 371-374. The volume/mute registers 371-374 can be accessed by the DSP 391 via a DSP interface 380. The audio volume control verb may be applicable to one or more of the audio channels being processed by the codec, so four volume/mute registers (one for each of four stereo pairs of channels) are provided in this embodiment to store the audio volume levels for the different channels.

The DSP 391 and the PWM output computation engine 392 are continually processing audio data that is received by the codec. As part of its background tasks, the DSP checks the volume/mute registers. In one embodiment, a status flag for each register may be set when the audio volume data stored in the register is updated. The DSP can then check the status flag to determine whether or not the audio volume for a particular channel needs to be adjusted. This may reduce the frequency with which the registers are read. If the data in a register has changed, the DSP can read the audio volume level from the register and modify the operation of the PWM output computation engine according to the new audio volume level. Typically, the audio volume level received over the HDA bus is encoded in decibel, so the DSP may convert the audio volume level to a linear value before using it to modify the operation of the PWM output computation engine.

Figure 4:
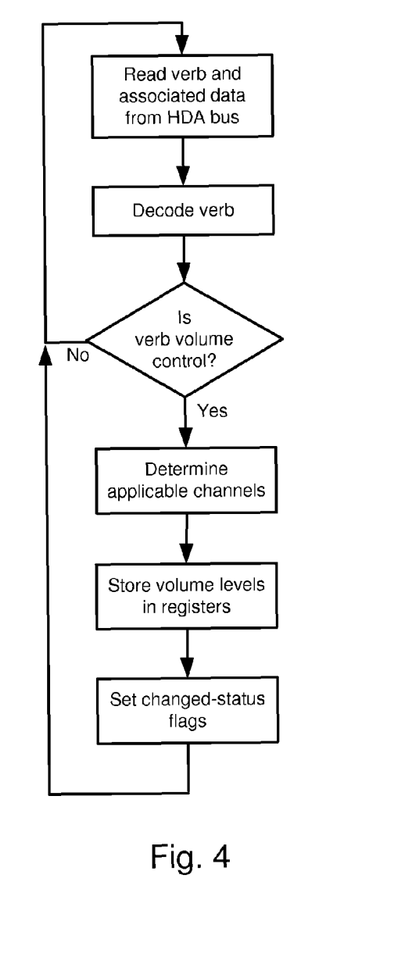
FIG. 4 is a flow diagram illustrating the reading of verbs and data from an HDA bus, storing audio volume levels in a codec's volume/mute registers, and setting status flags for the registers in accordance with one embodiment.
Figure 5:
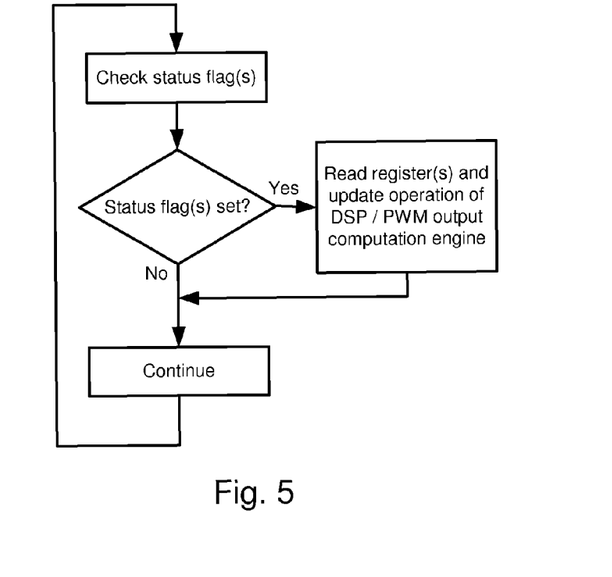
FIG. 5 is a flow diagram illustrating a method for checking status flags, reading volume/mute registers when necessary and updating the operation of a DSP and PWM output computation engine in accordance with one embodiment.

The operation of this system is illustrated by the flow diagram of FIGS. 4 and 5. FIG. 4 illustrates the reading of verbs and data from the HDA bus, storing audio volume levels in the codec's volume/mute registers, and setting the status flags for the registers. FIG. 5 illustrates the DSP checking the status flags, reading the volume/mute registers when necessary and updating the operation of the DSP and PWM output computation engine as needed.

It should be noted that the terms "PC" and "personal computer" are used herein to refer to a wide range of computing systems that are commonly purchased and used by individual consumers. These systems may include desktop computers, laptop computers, tablet computers and the like, and may be used in home, office, mobile or other environments. It should also be noted that, although the embodiments described above focus on codecs that incorporate DSP's, other embodiments may use types of processors other than DSP's (such as general purpose processors, programmable microcontrollers, etc.) to achieve the programmability, configurability and other advantages that are obtained through the use of a processor in the HDA codec.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A High Definition Audio (HDA) codec comprising:
   a programmable processor configured to receive one or more digital audio signals and to generate one or more pulse width modulated (PWM) output signals based on the received digital audio signals;
   wherein the programmable processor is configured to determine one or more audio volume control settings based on audio volume control verb commands received from an HDA bus and to adjust the audio volume of at least one of the one or more PWM output signals based on corresponding ones of the audio volume control settings; and
   wherein the programmable processor is configured to adjust deadtimes associated with at least one of the one or more PWM output signals based on the corresponding audio volume.

2. The HDA codec of claim 1, wherein the programmable processor is configured to adjust the audio volume of the one or more PWM output signals independently of any HDA widgets that are coupled to the programmable processor in the codec.

3. The HDA codec of claim 2, wherein the one or more HDA widgets include a converter widget configured to read time-multiplexed audio data from the HDA bus and to convert the time-multiplexed audio data to an internal digital audio data stream.

4. The HDA codec of claim 3, wherein the codec is configured to process the internal digital audio data stream in digital form to generate the one or more PWM output signals.

5. The HDA codec of claim 1, further comprising one or more volume/mute registers that are accessible by the programmable processor, wherein upon receipt of an audio volume control verb from the HDA bus, the codec is configured to store one or more audio volume levels associated with the audio volume control verb in the one or more volume/mute registers.

6. The HDA codec of claim 1, wherein the codec is configured to map a node ID for at least one of a mixer widget and a pin widget to the programmable processor.

7. The HDA codec of claim 1, wherein the programmable processor comprises a digital signal processor (DSP).

8. The HDA codec of claim 1, wherein the programmable processor is configured to suspend one or more functions when an audio volume level is zero, to thereby reduce power consumption when the audio volume level is zero.

9. A method for controlling audio volume in a High Definition Audio (HDA) codec incorporating a programmable processor, the method comprising:
   receiving one or more digital audio signals;
   receiving one or more audio volume control verbs and associated audio volume levels; and
   generating one or more pulse width modulated (PWM) output signals based on the received digital audio signals and the audio volume levels; and
   adjusting deadtimes associated with at least one of the one or more PWM output signals based on the audio volume levels.

10. The method of claim 9, wherein generating the one or more PWM output signals based on the received digital audio signals and the audio volume levels comprises adjusting an audio volume of at least one of the one or more PWM output signals based on the audio volume levels.

11. The method of claim 10, wherein generating the one or more PWM output signals based on the received digital audio signals and the audio volume levels further comprises adjusting at least one non-volume parameter of the one or more PWM output signals based on the audio volume levels.

12. The method of claim 9, wherein the one or more digital audio signals comprise time-multiplexed audio data, and wherein the method further comprises converting the time-multiplexed audio data to an internal digital audio data stream.

13. The method of claim 12, further comprising digitally modifying the internal digital audio data stream to implement audio effects processing.

14. The method of claim 9, further comprising storing received audio volume levels in one or more volume/mute registers that are accessible by the programmable processor.

15. The method of claim 14, further comprising:
   setting one or more status flags corresponding to the one or more volume/mute registers after storing the received audio volume levels in the one or more volume/mute registers;

checking the one or more status flags to thereby determine whether or not the audio volume for one or more channels needs to be adjusted;

reading the audio volume levels from one or more of the volume/mute registers if there is a determination, based on the checking the one or more status flags, that the audio volume for one or more channels needs to be adjusted; and not reading the audio volume levels from one or more of the volume/mute registers if there is a determination, based on the checking the one or more status flags, that the audio volume for one or more channels does not need to be adjusted.

16. The method of claim 9, further comprising mapping a node ID for a mixer widget to the programmable processor and forwarding data associated with the node ID for the mixer widget to the programmable processor.

17. The method of claim 16, further comprising mapping a node ID for a pin widget to the programmable processor and forwarding data associated with the node ID for the pin widget to the programmable processor.

18. The method of claim 9, further comprising suspending one or more functions when at least one of the audio volume levels is zero, to thereby reduce power consumption.

19. A High Definition Audio (HDA) system comprising:
an HDA controller;
an HDA bus coupled to the HDA controller; and
an HDA codec coupled to the HDA bus, wherein the codec includes a programmable processor within the codec that is configured to function as a Class-D pulse width modulated (PMW) controller and to thereby generate PWM output signals, wherein the programmable processor is further configured to adjust the PWM output signals responsive to HDA audio volume control verbs received by the codec via the HDA bus;
wherein the programmable processor of the HDA codec is configured to adjust deadtimes associated with the PWM output signals in dependence on audio volume levels specified by the audio volume control verbs received by the codec via the HDA bus.

20. The HDA system of claim 19, wherein the programmable processor comprises a digital signal processor (DSP).

21. The HDA system of claim 19, wherein the programmable processor is configured to adjust the audio volume of the PWM output signals independently of any HDA widgets that are coupled to the programmable processor in the codec.

22. The HDA system of claim 21, wherein the one or more HDA widgets include a converter widget configured to read time-multiplexed audio data from the HDA bus and to convert the time-multiplexed audio data to an internal digital audio data stream.

23. The HDA system of claim 22, wherein the codec is configured to process the internal digital audio data stream in digital form to generate the PWM output signals.

24. The HDA system of claim 19, further comprising one or more volume/mute registers that are accessible by the programmable processor, wherein upon receipt of a audio volume control verb from the HDA bus, the codec is configured to store one or more audio volume levels associated with the audio volume control verb in the one or more volume/mute registers.

25. The HDA system of claim 19, wherein the codec is configured to map a node ID for at least one of a mixer widget and a pin widget to the programmable processor.

26. The HDA system of claim 19, wherein the programmable processor of the HDA codec is configured to suspend one or more functions when an audio volume level is zero, to thereby reduce power consumption when the audio volume level is zero.

* * * * *